(12) United States Patent
Hsu et al.

(10) Patent No.: US 6,674,673 B1
(45) Date of Patent: Jan. 6, 2004

(54) COLUMN REDUNDANCY SYSTEM AND METHOD FOR A MICRO-CELL EMBEDDED DRAM (E-DRAM) ARCHITECTURE

(75) Inventors: Louis Lu-Chen Hsu, Fishkill, NY (US); Gregory Fredeman, Staatsburg, NY (US); Chorng-Lii Hwang, Wappingers Falls, NY (US); Toshiaki Kirihata, Poughkeepsie, NY (US); Dale E. Pontius, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 10/064,867

(22) Filed: Aug. 26, 2002

(51) Int. Cl.$^7$ ................................................ G11C 7/00
(52) U.S. Cl. .............. 365/200; 365/230.03; 365/230.06
(58) Field of Search ........................... 365/200, 230.03, 365/230.06, 189.02, 189.07

(56) References Cited

U.S. PATENT DOCUMENTS

| 5,627,963 A |   | 5/1997  | Gabillard et al. ...... 395/183.18 |
|---|---|---|---|
| 5,673,227 A | * | 9/1997  | Engles et al. ............... 365/200 |
| 5,732,030 A |   | 3/1998  | Dorney ....................... 365/200 |
| 5,875,451 A |   | 2/1999  | Joseph ....................... 711/105 |
| 5,887,272 A |   | 3/1999  | Satore et al. ............... 711/105 |
| 5,953,745 A |   | 9/1999  | Lattimore et al. .......... 711/162 |
| 5,999,463 A | * | 12/1999 | Park et al. .................. 365/200 |
| 6,072,741 A |   | 6/2000  | Taylor ........................ 365/219 |
| 6,094,384 A | * | 7/2000  | Ka .............................. 365/200 |
| 6,115,300 A |   | 9/2000  | Massoumi et al. .......... 365/200 |
| 6,137,735 A |   | 10/2000 | Wei et al. ................... 365/200 |
| 6,141,268 A |   | 10/2000 | Chen et al. ................. 365/200 |
| 6,144,592 A | * | 11/2000 | Kanda ........................ 365/200 |
| 6,151,664 A |   | 11/2000 | Borkenhagen et al. ...... 711/150 |

* cited by examiner

*Primary Examiner*—Anh Phung
(74) *Attorney, Agent, or Firm*—Robert Walsh; Cantor Colburn LLP

(57) ABSTRACT

A column redundancy system including a column redundancy apparatus for performing a redundancy swapping operation of column elements within the individual micro-cells. The column redundancy apparatus further includes a fuse information storage device, a first bank address decoding mechanism decodes a read bank address corresponding to a first micro-cell accessed for a read operation, and a second bank address decoding mechanism decodes a write bank address corresponding to a second micro-cell accessed for a write operation. If there is at least one defective column element contained within the first micro-cell, then the column redundancy apparatus generates an internal column address corresponding to the at least one defective column element in the first micro-cell. Likewise, if there is at least one defective column element contained within the second micro-cell, then the column redundancy apparatus generates an internal column address corresponding to the at least one defective column element in the second micro-cell.

10 Claims, 12 Drawing Sheets

US 6,674,673 B1

COLUMN REDUNDANCY SYSTEM AND METHOD FOR A MICRO-CELL EMBEDDED DRAM (E-DRAM) ARCHITECTURE

BACKGROUND OF THE INVENTION

The present invention relates generally to integrated circuit memory devices and, more particularly, to a column redundancy system and method for a micro-cell eDRAM architecture.

The replacement of static random access memory (SRAM) with a wide bandwidth, embedded dynamic random access memory (eDRAM) for a high-speed, on-chip cache has become a recent trend in the semiconductor memory industry. Because DRAM is inherently smaller than SRAM, a comparatively larger DRAM cache may be installed on a chip to improve processor performance. On the other hand, the speed of a DRAM is generally inferior to that of an SRAM. Thus, in order to boost the performance of a DRAM based on-chip cache, a micro-cell eDRAM architecture may be implemented.

In a micro-cell eDRAM architecture, a DRAM array is further organized into a plurality of smaller DRAM arrays, or "micro-cells". Each individual micro-cell may include, for example, 64 to 256 wordlines and 64 to 256 bitline pairs. Accordingly, each micro-cell array may be about 16 to 256 times smaller than a standard DRAM array. By accessing an individual DRAM micro-cell having shorter wordlines and bitline pairs (having smaller parasitic capacitances), a faster read/write operation may be achieved over a conventional array. As a result, a wide bandwidth eDRAM with a micro-cell architecture demonstrates improved performance in terms of faster cycle time and access time.

A micro-cell eDRAM design may also include one or more SRAM macros which serve as a cache interface between a plurality of eDRAM arrays and the processor. Since the size of such an SRAM macro is rough equivalent to that of a micro-cell, the area penalty is acceptable. However, a relatively wide internal bus is used to facilitate a high data transfer rate among the eDRAM arrays, the SRAM macro(s), and the processor. A small TAG memory may also be used to record the addresses of those particular micro-cells having data therefrom temporarily stored in the SRAM cache.

As is the case with a conventional eDRAM architecture, all data bits along a selected wordline of a micro-cell are accessed at once; thus, no column decoding functions are used in an eDRAM system. However, the elimination of a column decoding function in a micro-cell eDRAM architecture presents certain challenges in the column path design. Not only does the column path layout become very difficult (due to pitch limitations), but a conventional column redundancy circuit design becomes inefficient for this type of architecture.

More specifically, one challenge in the wide datawidth eDRAM design is to provide an effective column repair system for replacing defective column elements (e.g., bitlines, local and global datalines, etc.) with redundancy elements. In a conventional DRAM array, bitlines are hierarchically grouped by their column addresses, such that "partial data" accessed for a read or write command is possible. In other words, not all of the data in a given row need be transferred out. The most common column redundancy system for a conventional DRAM is to replace an entire group of bitlines (e.g., 4 bitlines per group), regardless of how many particular bitlines in that group are actually defective. However, for a wide datawidth eDRAM design as described above, all of the bitlines in a given eDRAM micro-cell are be retrieved and sent to the SRAM cache. Without a column address provided, a column redundancy operation thus becomes a difficult proposition.

BRIEF SUMMARY

The above discussed and other drawbacks and deficiencies of the prior art are overcome or alleviated by a column redundancy system for a memory array configured into a plurality of individual micro-cells. In an exemplary embodiment, the system includes a column redundancy apparatus for performing a redundancy swapping operation of column elements within the individual micro-cells. The column redundancy apparatus further includes a fuse information storage device for storing fuse information for each individual micro-cell, the fuse information indicative of the location of any defective column elements therein. A first bank address decoding mechanism decodes a read bank address corresponding to a first micro-cell accessed for a read operation, and a second bank address decoding mechanism decodes a write bank address corresponding to a second micro-cell accessed for a write operation. The second micro-cell is capable of being accessed simultaneously with the first micro-cell. In addition, a first compare circuit compares the decoded read bank address to specific fuse information corresponding to said first micro-cell, and a second compare circuit compares the decoded write bank address to specific fuse information corresponding to the second micro-cell. If the first compare circuit determines that there is at least one defective column element contained within the first micro-cell, then the column redundancy apparatus generates an internal column address corresponding to the at least one defective column element in the first micro-cell. Likewise, if the second compare circuit determines that there is at least one defective column element contained within the second micro-cell, then the column redundancy apparatus generates an internal column address corresponding to the at least one defective column element in the second micro-cell.

In a preferred embodiment, the internal column address corresponding to the at least one defective column element in said first micro-cell, if generated, is used by a read multiplexer circuit within the column redundancy apparatus to perform the redundancy swapping operation for the first micro-cell. The internal column address corresponding to the at least one defective column element in the second micro-cell, if generated, is used by a write multiplexer circuit within the column redundancy apparatus to perform the redundancy swapping operation for the second micro-cell.

In one embodiment, the plurality of individual micro-cells within the memory array are arranged into micro-cell blocks, and the fuse information storage device further includes a plurality of fuse register blocks disposed in proximity to the micro-cell blocks. In another embodiment, the fuse information storage device further includes a first static random access memory (SRAM) array which is accessed for a read operation, and a second static random access memory (SRAM) array which is being accessed for a write operation. In still another embodiment, the fuse information storage device further includes a dual port, static random access memory (SRAM) array. One port is capable of being accessed only during a read operation, and the other port is capable of being accessed during a read or a write operation.

BRIEF DESCRIPTION OF THE DRAWINGS

Referring to the exemplary drawings wherein like elements are numbered alike in the several Figures.

DETAILED DESCRIPTION OF THE INVENTION

Disclosed herein is a novel column redundancy system for a wide datawidth eDRAM system having a micro-cell architecture. The redundancy system is characterized by a dual redundancy arrangement such that, within a given clock cycle, both a read and a write operation can be simultaneously processed within two different banks (micro-cells). This is accomplished, in one embodiment, through a distributed fuse information storage device provided for each unit or group of eDRAM micro-cells. In another embodiment, a centralized fuse information storage device is located adjacent the redundancy circuitry in order to enhance the speed of the redundancy operation. The centralized fuse information storage device may include a pair of single port SRAM arrays or, in another aspect, a dual port SRAM array for storing fuse data. With each embodiment, a device layout is presented for the location of the pitch-limited column redundancy hardware.

Figure 1:
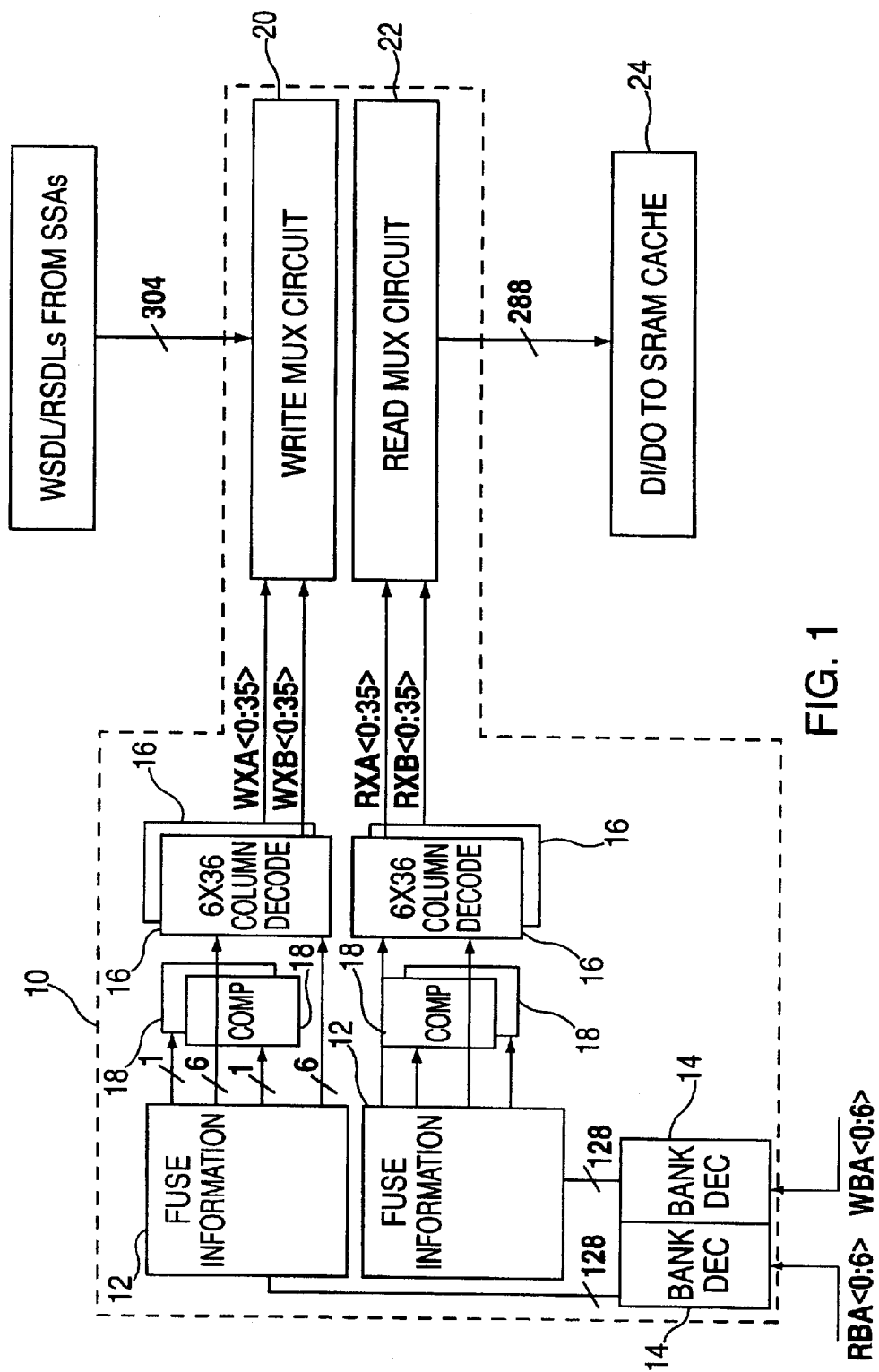
FIG. 1 is a schematic block diagram of a column redundancy apparatus configured for use with a micro-cell eDRAM architecture, in accordance with an embodiment of the invention.

Referring initially to FIG. 1, there is shown a schematic block diagram of a column redundancy apparatus 10 configured for use with a micro-cell eDRAM architecture, in accordance with an embodiment of the invention. Broadly stated, the column redundancy apparatus 10 uses the address of an accessed micro-cell to and compares it with the addresses of failed components stored in a fuse information storage device 12. If a match is found, an "internal column address" is effectively created and thereafter used to perform the column redundancy swapping operation. These address matching and redundancy swapping operations may further be carried out dynamically at high speed. Moreover, a simultaneous read/write operation to two separate micro-cells may also be carried out while still maintaining a smooth column redundancy operation.

The column redundancy operation steps will be understood with reference to FIG. 1. During each clock cycle, a write bank address (designated WBA<0:6>) and a read bank address (designated RBA<0:6>) are issued by a CPU (not shown). The write bank address WBA and the read bank address RBA each indicate which micro-cells have received a write operation and a read operation request, respectively. In the example illustrated, the read and write bank addresses comprise 7 bits, signifying that each DRAM array is organized into 128 micro-cells. It should be understood, however, that a smaller or larger number of micro-cells may be defined within an array.

The column redundancy apparatus 10 further includes a pair of bank address decoders 14, one for the read bank address and one for the write bank address. The decoders 14 will thus decode the incoming addresses and select two banks (micro-cells) out of a total of 128 (again one for a read operation and one for a write operation). Each bank in the array has specific fuse information associated therewith. In one embodiment, the fuse information storage device 12 includes fuse latch registers, as will be described in greater detail hereinafter. The fuse information contained in the fuse information storage device 12 further indicates whether any fuses in the corresponding micro-cell have been blown. If a fuse has been blown, then the fuse latch register further indicates the particular address of the defective column (s) in the micro-cell.

In the example illustrated, each micro-cell includes 144 "normal" data lines, organized into 36 groups of 4 data lines. There are also 8 redundant data lines organized into two groups of 4 data lines. Therefore, up to 2 of the 36 groups of normal data lines may be replaced in each micro-cell. As shown in FIG. 1, the fuse information for each micro-cell is organized into a pair of "master" bits which indicate whether either or both groups of redundancy data lines are used. In addition, each master bit is associated with 6 "slave" bits which indicate the column group address of the specific group of data lines replaced by the redundancy lines. If the master fuse bit indicates that the master fuse is not blown, then no data line replacement occurs (i.e., the group of redundancy lines is not used) and the associated slave bit information is ignored. Again, since two redundancy "elements" are provided in each micro-cell, the corresponding fuse information is divided into two parts. However, it is contemplated that a different number of redundancy elements and groupings may be configured for repair operations.

The fuse information for both a "read" bank and a "write" bank are simultaneously retrieved. Accordingly, a total of four (6×36) column decoders 16 are shown; two for decoding the read bank redundancy information, and two for decoding the write bank redundancy information. In addition, there are four compare circuit blocks 18; two for the read bank, and two for the write bank. The compare circuit blocks 18 are used to determine the status of the master bits.

Two pairs of decoded addresses (WXA, WXB and RXA, RXB) are generated by the four 6×36 decoders 16. The first pair of decoded addresses (WXA, WXB) are sent to a write multiplexer circuit 20, while the second pair of decoded addresses (RXA, RXB) are sent to a read multiplexer circuit 22. The read and write multiplexer circuits 22, 20 execute the rerouting of bad data lines in accordance with the two pairs of decoded addresses. Accordingly, there are a total of 304 data lines (288 normal data lines, 16 redundant data lines) inputted into the column redundancy apparatus 10, and 288 data lines outputted from the column redundancy apparatus 10 to the SRAM cache 24.

Figure 2:
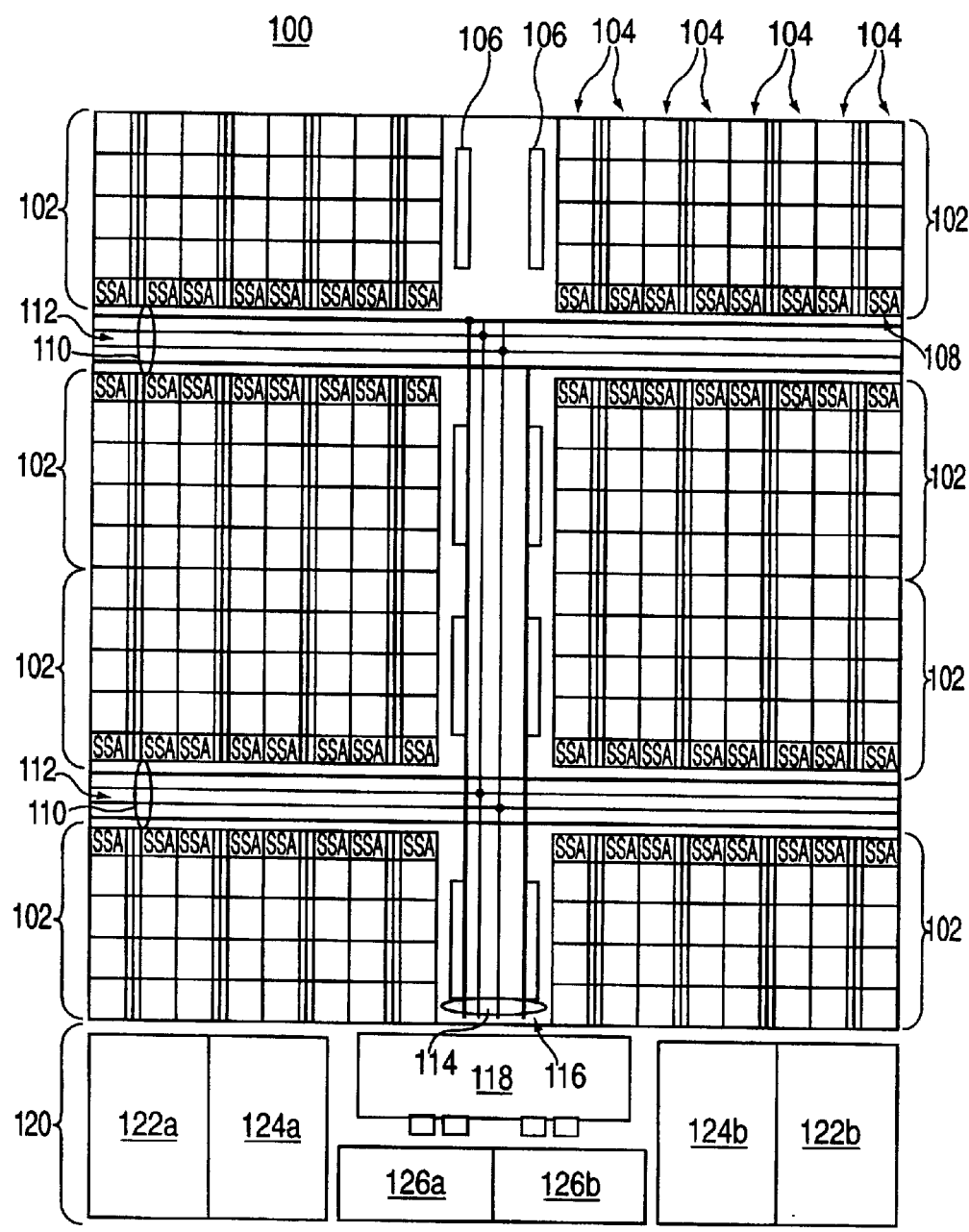
FIG. 2 is a schematic block diagram of a first embodiment of a column redundancy system for a micro-cell eDRAM architecture, implementing the column redundancy apparatus shown in FIG. 1.

Referring now to FIG. 2, there is illustrated a first embodiment for a column redundancy system for a micro-cell eDRAM architecture, which system implements the column redundancy apparatus 10 generally shown and described in FIG. 1. The embodiment of FIG. 2 may be characterized as a "distributed fuse register" system. An 8M page of a 16M eDRAM array 100 is organized into eight, 1M eDRAM micro-cell blocks 102. Each block 102 is in turn made up of 8 eDRAM micro-cells 104 or banks. Disposed in proximity to each eDRAM block 102 is a corresponding fuse register block 106 which stores the fuse information for each of the 8 micro-cells 104 within the block 102. The 8 fuse register blocks of this embodiment correspond to the fuse information storage device 12.

Associated with each micro-cell 104 is a secondary sense amplifier block 108, wherein local data lines (not shown) from each secondary sense amplifier block 108 are connected to global data lines 110 which are disposed horizontally along a pair of arm regions 112 within the page of the array 100. The horizontally disposed data lines 110 are further connected to vertically disposed data lines 114 located in a central or spine region 116 of the array 100. For ease of illustration, the total number of data lines (304) originating from the secondary sense amplifier blocks 108 are represented as two thick lines and two thin lines. Each thick line represents 144 data lines (72 for read and 72 for write), while each thin line represents the 8 redundant data lines. The vertically disposed data lines 114 are further coupled to a redundancy circuit block 118 within a support region 120 of the eDRAM array 110. The support area may also include other circuit blocks (e.g., control circuits, clock buffers, test circuits, etc.) 122a, 122b, SRAM data in/data out caches, 124a and 124b, DC generators, 126a and 126b, as well as BIST circuitry.

When a read bank address and a write bank address is selected, the fuse information as described above will be found in the particular fuse register block 106 corresponding to the selected micro-cell for the read/write operations. The fuse information therein is sent down to the redundancy circuit block 118 for the decoding and multiplexing operations as shown and described in FIG. 1.

Figure 3:
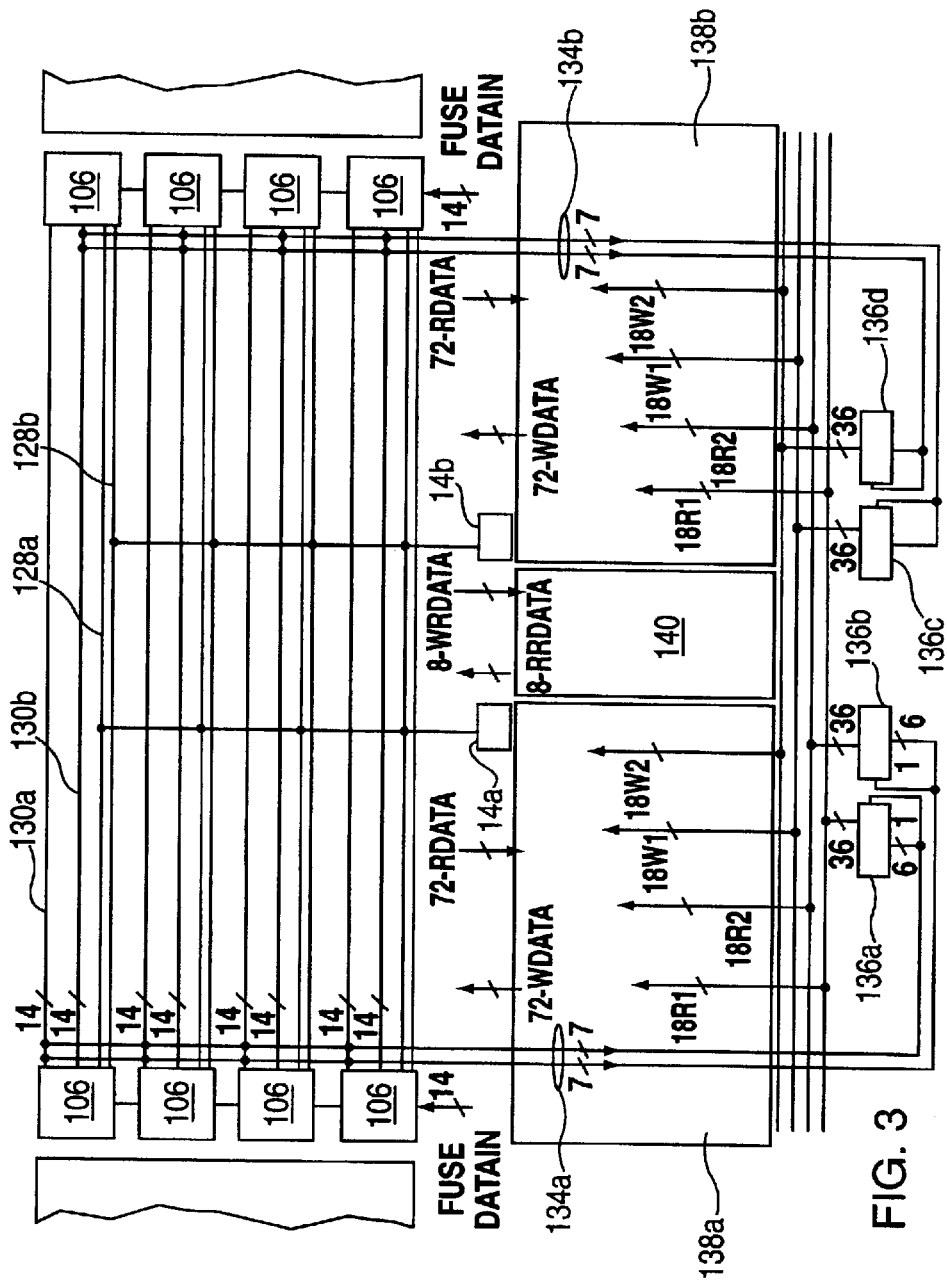
FIG. 3 is a more detailed schematical illustration of FIG. 2.

FIG. 3 is a more detailed schematical illustration of FIG. 2. Although only an 8M array is shown in this example, it should be understood that an additional 8M block may be stacked on top of the existing 8M block to increase the eDRAM size. As was also shown in FIG. 2, a total of eight fuse register blocks 106 are provided. Four are located on one side of the array, and four on the opposite side of the array. Both the read bank decoder 14 and the write bank decoder 14 are coupled to each of the fuse register blocks for bank address decoding. The read bank decoder 14 is coupled to the fuse register blocks 106 through bus 128a, while the write bank decoder 14 is coupled to the fuse register blocks 106 through bus 128b. It will also be recalled that each fuse register block 106 contains 8 groups of fuse information therein, one group for each of the 8 micro-cells in the 1M block. Again, each group of fuse information further includes two sub-groups, 1 master fuse and 6 slave fuses for each redundancy. Therefore, a total of 14 fuse information bits are retrieved each time from a given micro-cell in a given fuse register block 106.

When a particular fuse register block 106 is accessed by a read bank address, the 14 bits of fuse information will be sent through a read fuse information bus 130a. Similarly, if a fuse register block 106 is accessed with a write bank address, the 14 bits of fuse information will be sent through a write fuse information bus 130b. As will be recalled from FIG. 1, the 14 bits of the read fuse information are split into two groups of 7 bits and sent via bus 134a to two read decoders, 136a and 136b. Each read decoder 136a, 136b, includes a 6×36 column decoder 16 and a compare circuit block 18 (FIG. 1). Likewise, the 14 bits of write fuse information are split into two groups of 7 bits and sent via bus 134b to two write decoders, 136c and 136d. Each write decoder, 136c, 136d, includes a 6×36 column decoder 16 and a compare circuit block 18.

The decoded group addresses from the read and write decoders (136a–136d) are sent to corresponding multiplexer circuit blocks 138a and 138b. It will be noted that half of the 144 read and 144 write data lines are configured within the left multiplexer circuit block 138a, with the other half configured within the right multiplexer circuit block 138b. The 8 redundant read data lines and 8 write redundant data lines are configured within center block 140. Such an arrangement provides for a symmetrical circuit layout, although other arrangements are also possible.

One advantage of the layout disclosed in the first embodiment is that the fuse register blocks and fuse registers are expandable. If the array size is increased, the proper sizing of the fuse registers and fuse register blocks are automatically determined. During power on of the system, the fuse data is sequentially scanned into the fuse registers until the last register is loaded. However, if the size of the eDRAM is significantly expanded, a speed penalty may result in the retrieval of the fuse information, especially for the data located in the fuse register blocks located at the remote ends of the array.

Figure 4:
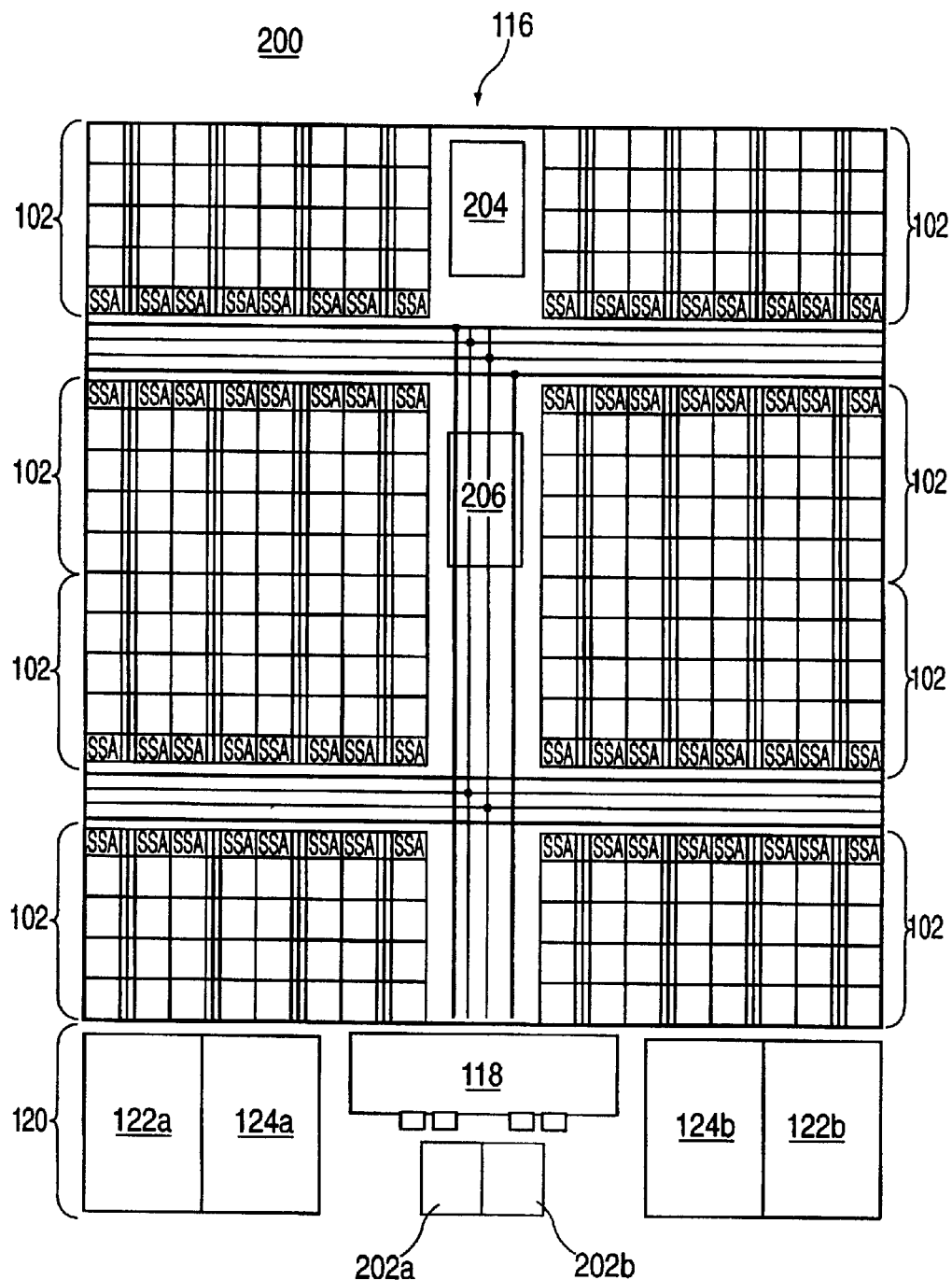
FIG. 4 is a schematic block diagram of a second embodiment of a column redundancy system for a micro-cell eDRAM architecture, implementing the column redundancy apparatus shown in FIG. 1.

Referring now to FIG. 4, there is illustrated a second embodiment for a column redundancy system for a micro-cell eDRAM architecture, which system also implements the column redundancy circuitry generally described in FIG. 1. In contrast to the distributed fuse register approach of FIGS. 2 and 3, a centralized fuse information storage arrangement is disclosed. As can be seen in FIG. 4, an 8M eDRAM array 200 is depicted. However, instead of having 8 fuse register blocks located adjacent each of the 1M blocks, two SRAM macros 202a and 202b are used as the fuse information storage device 12 to store the fuse information for the entire array. With the 8M array shown, having a total of 64 micro-cells, an SRAM macro having 64 word lines are needed. Thus, one SRAM macro 202a stores the fuse information for a read operation, while the other SRAM macro 202b stores the same fuse information for a write operation. Thereby, a read and write operation may be carried out simultaneously (although not to the same micro-cell at the same time), just as may be done with the first embodiment.

With the second embodiment of FIG. 4, the central or spine area 116 (occupied in part by the fuse register blocks in the first embodiment) may be utilized for other components, such as a DC generator 204 and a decoupling capacitor 206, for example. It will be further noted that, in contrast to the first embodiment, bank address decoders are not used since each SRAM macro has its own decoding circuit associated therewith. Accordingly, the second embodiment is preferred in terms of a compact design. In addition, the speed of operation will be improved over that of the first embodiment, since the fuse information retrieval is quicker due to the high speed of SRAM operation. Still a further benefit is the elimination of signal wiring congestion between the fuse registers and the redundancy circuitry.

Figure 5:
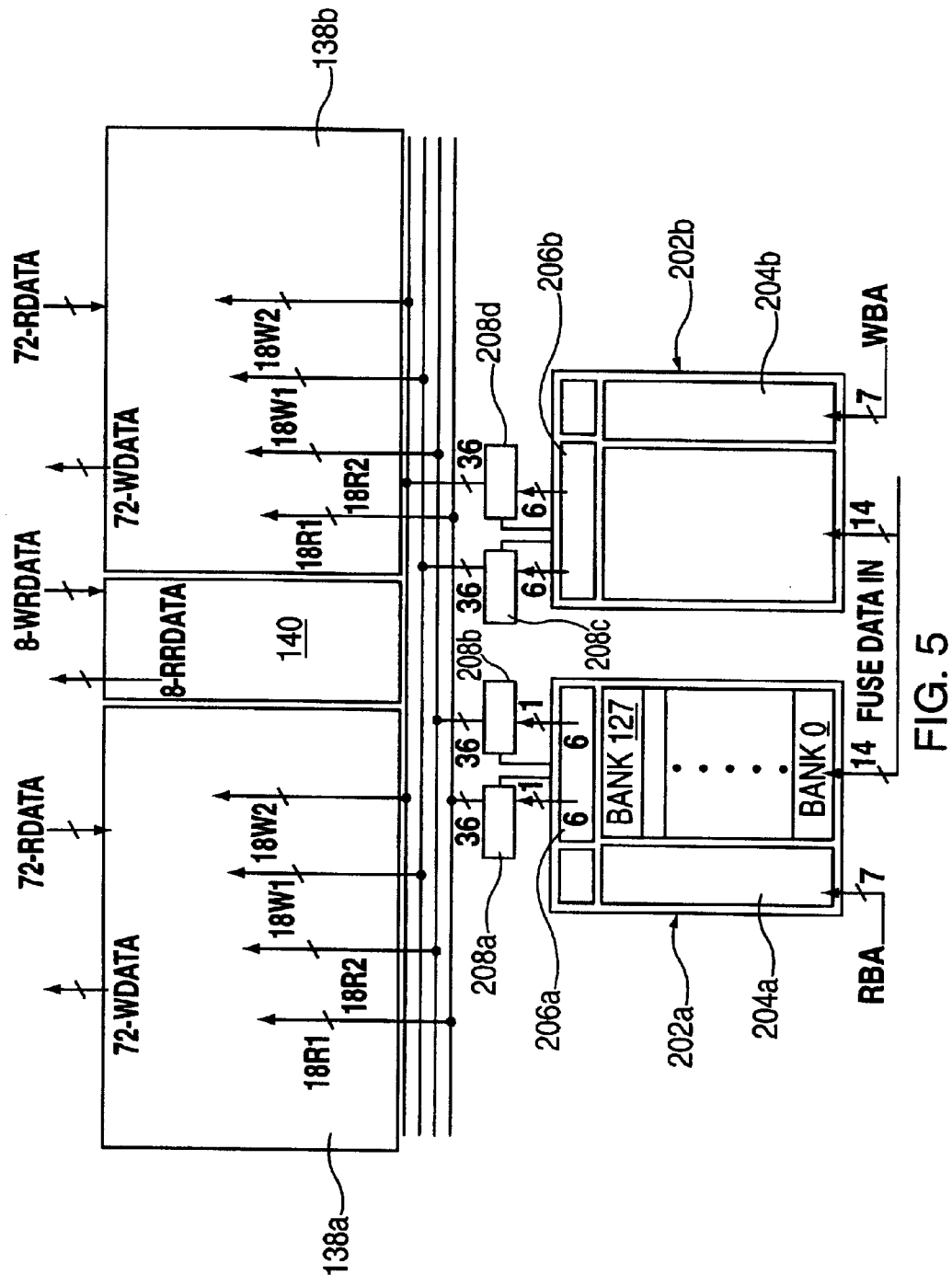
FIG. 5 is a more detailed schematical illustration of FIG. 4.

A detailed diagram of the second embodiment is shown in FIG. 5. In addition to the multiplexer circuit blocks 138a, 138b and the center block 140, the two SRAM arrays 202a, 202b are shown in greater detail. It will be noted that the SRAMs shown in FIG. 5 are actually sized for a 16M eDRAM array design, as 128 entries are included therein for storing the fuse information for 128 micro-cells. Unlike the centralized fuse storage system described above, the second embodiment is not as easily expandable. Thus, extra storage capability is preferably provided for the potential growth of the eDRAM array.

Each SRAM array 202a, 202b, includes a corresponding row address decoder 204a, 204b, for selecting a bank (micro-cell) based on the 7 bit incoming bank address (RBA<0:6> or WBA<0:6>). A sense amplifier 206a, 206b is used to amplify the fuse information data in each SRAM array 202a, 202b for external transmission. When the fuse data in each SRAM is accessed, 14 bits are read. Similar to the distributed fuse register embodiment, 7 of the 14 fuse data bits are sent to a first MUX decoder 208a, 208c, and the other 7 bits are sent to a second MUX decoder, 208b, 208d. Of the seven bits, the master bit determines whether a redundant element is used and thus whether the remaining six address bits are decoded. The MUX decoders each generate 36 bits to control the switching of the multiplexer for redundant element replacement. An exemplary embodiment for the multiplexer is discussed hereinafter.

Figure 6:
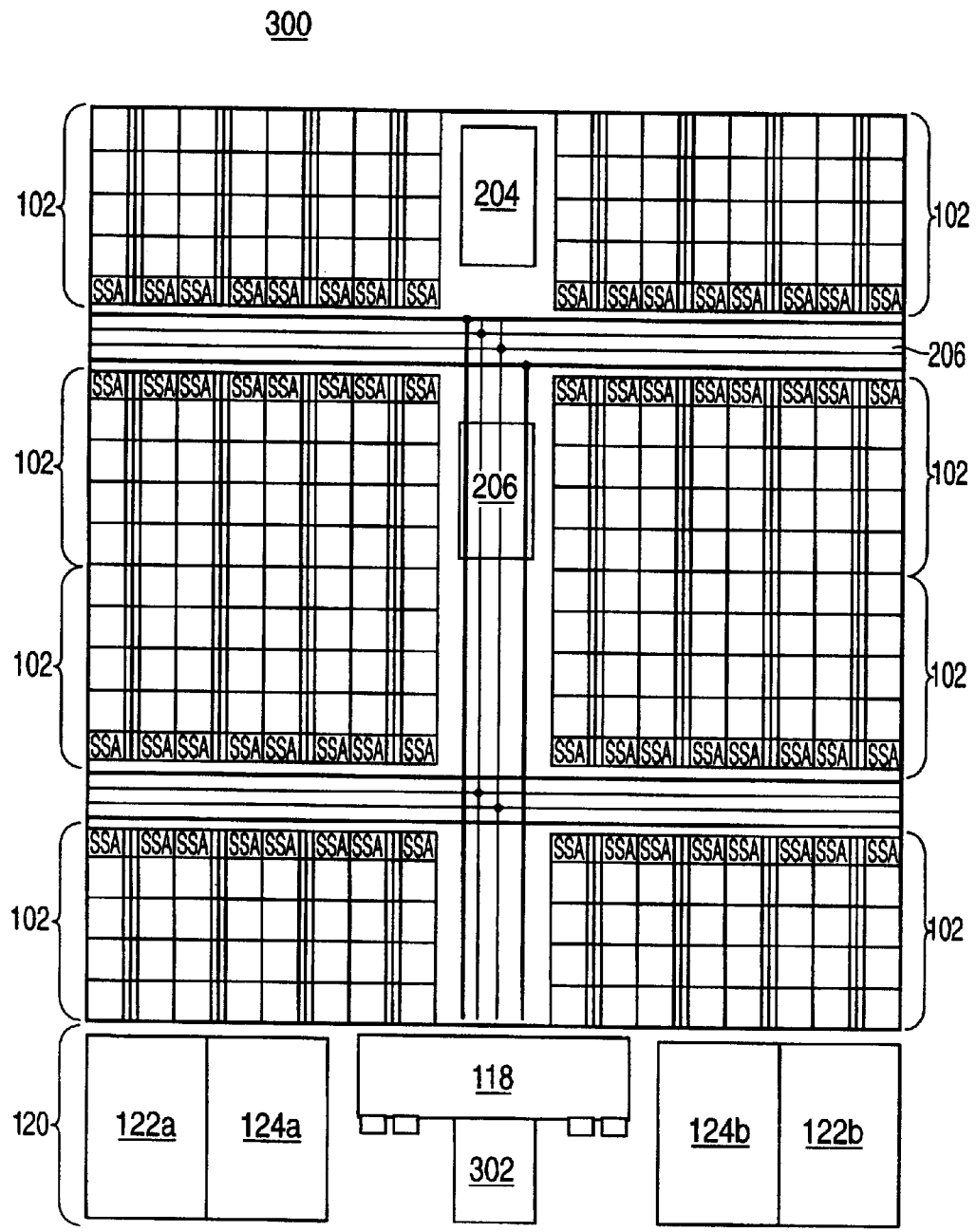
FIG. 6 is a schematic block diagram of a third embodiment of a column redundancy system for a micro-cell eDRAM architecture, implementing the column redundancy apparatus shown in FIG. 1.

A third embodiment for a column redundancy system for a micro-cell eDRAM array 300 is shown in FIG. 6. In this embodiment, instead of using a pair of SRAM macros for storing the fuse information (one for read, one for write), a single, dual port SRAM 302 is implemented. By using a dual port SRAM 302, additional array space may be saved. In addition, the dual port SRAM need only store a single set of fuse data that may be accessed for a read and write operation. The dual port SRAM 302 may include one port designed for read/write, and the other port for read only to simplify the design and reduce the SRAM size.

Figure 7:
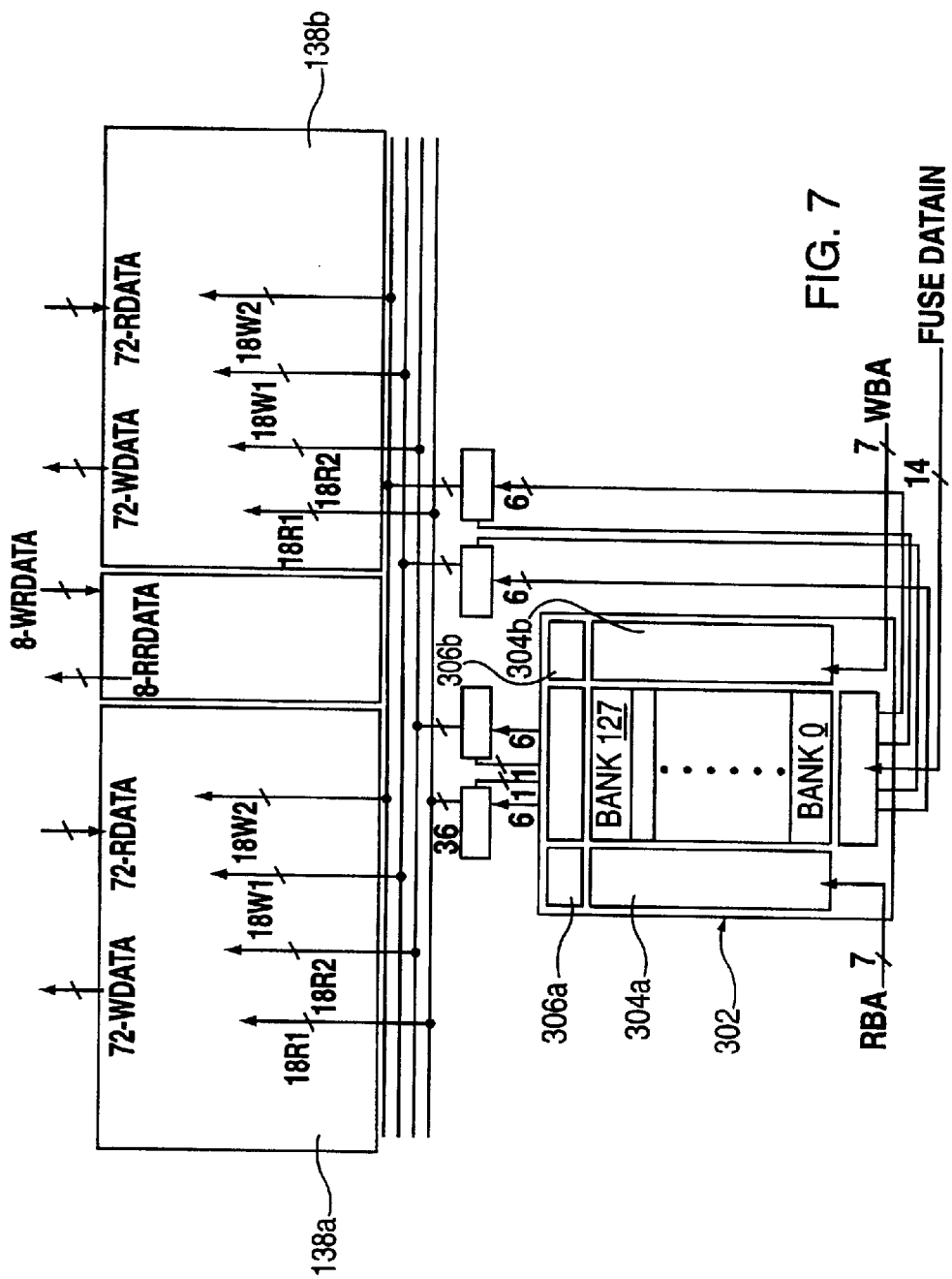
FIG. 7 is a more detailed schematical illustration of FIG. 6.

A detailed schematic of the third embodiment is shown in FIG. 7. In the dual-port SRAM 302, two row decoders are provided, 304a for read bank decoding and 304b for write bank decoding. For each row decoder, a row address decoder 306a, 306b is used to decode the row for loading the fuse data transferred from a remote fuse bank (not shown) during the power-on period. During each clock cycle, the 7 bit read bank address enters the read bank decoder 304a, while the 7 bit write bank address enters the write bank decoder 304b to access the fuse information. The remainder of the column redundancy operation is the same as the previous embodiments described earlier.

Figure 8:
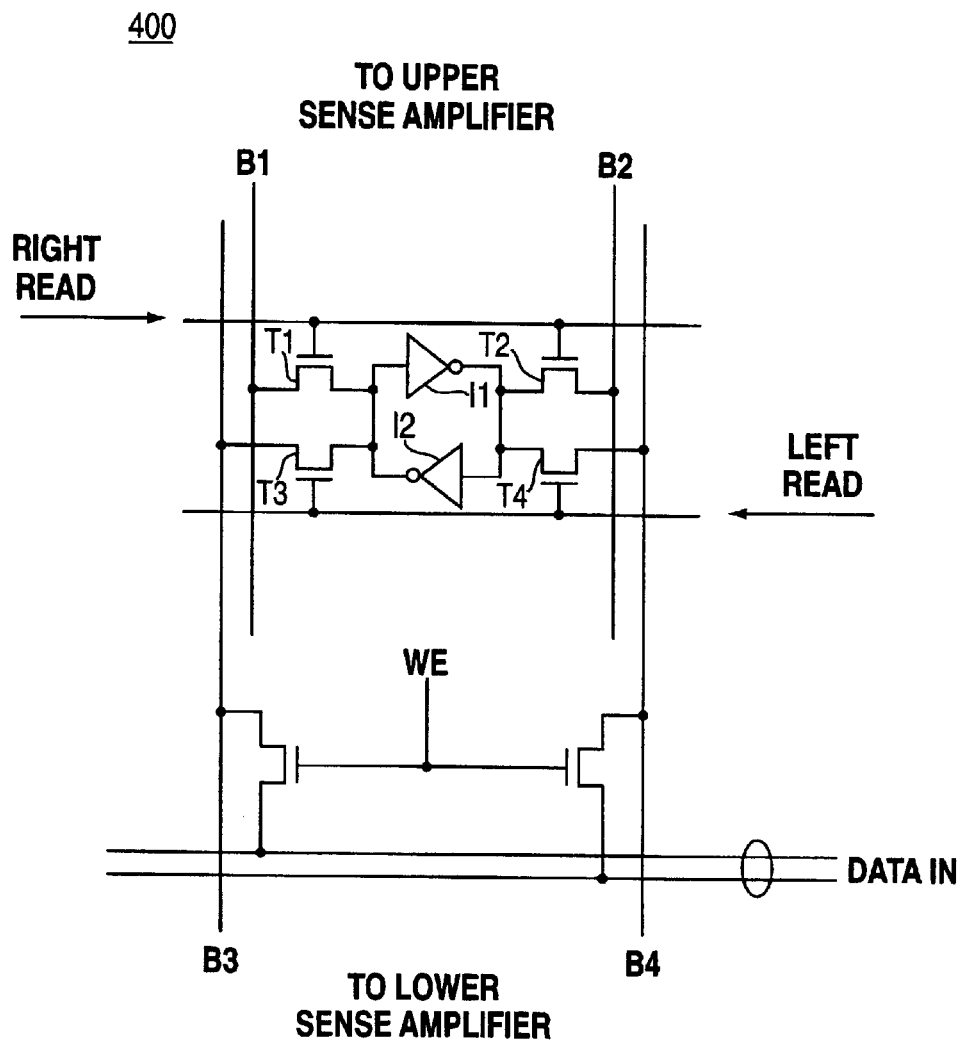
FIG. 8 is a schematic diagram of an exemplary dual port SRAM cell which may be used in the third embodiment of FIGS. 6 and 7.

FIG. 8 illustrates an embodiment of a dual port SRAM cell 400 such may be used in the third embodiment of FIGS. 6 and 7. The cell 400 included access transistors embodied by four NFETs designated T1 through T4, as well as a data storage latch including cross-coupled inverters I1 and I2 for storing a binary bit of information. A first port is defined through pair of transfer gates, T1 and T2, that are used for a "right read" access from a word line driver (not shown). The cell data is sensed by a sense amplifier (not shown) located at the top of the array via a first pair of bitlines, B1 and B2. A second port is defined through a second pair of transfer gates, T3 and T4, that are used for a "left" read access. Data stored in cell 400 may also be sensed by a sense amplifier (not shown) located at the bottom of the array via a second pair of bitlines, B3 and B4.

The second port may also be used for writing a data bit into the SRAM cell 400. When a write signal (WE) is activated, data is fed from data in/out lines, through the second pair of bitlines B3 and B4, and into storage latch I1 and I2. Furthermore, the data in the cell 400 may be simultaneously accessed via the a left and a right read port. For example, the left read port may provide fuse information corresponding to the read bank address, while the right read port may provide fuse information corresponding to the write bank address. It will be recalled, however, that the read and write operations are not simultaneously performed on the same micro-cell.

Figure 9A:
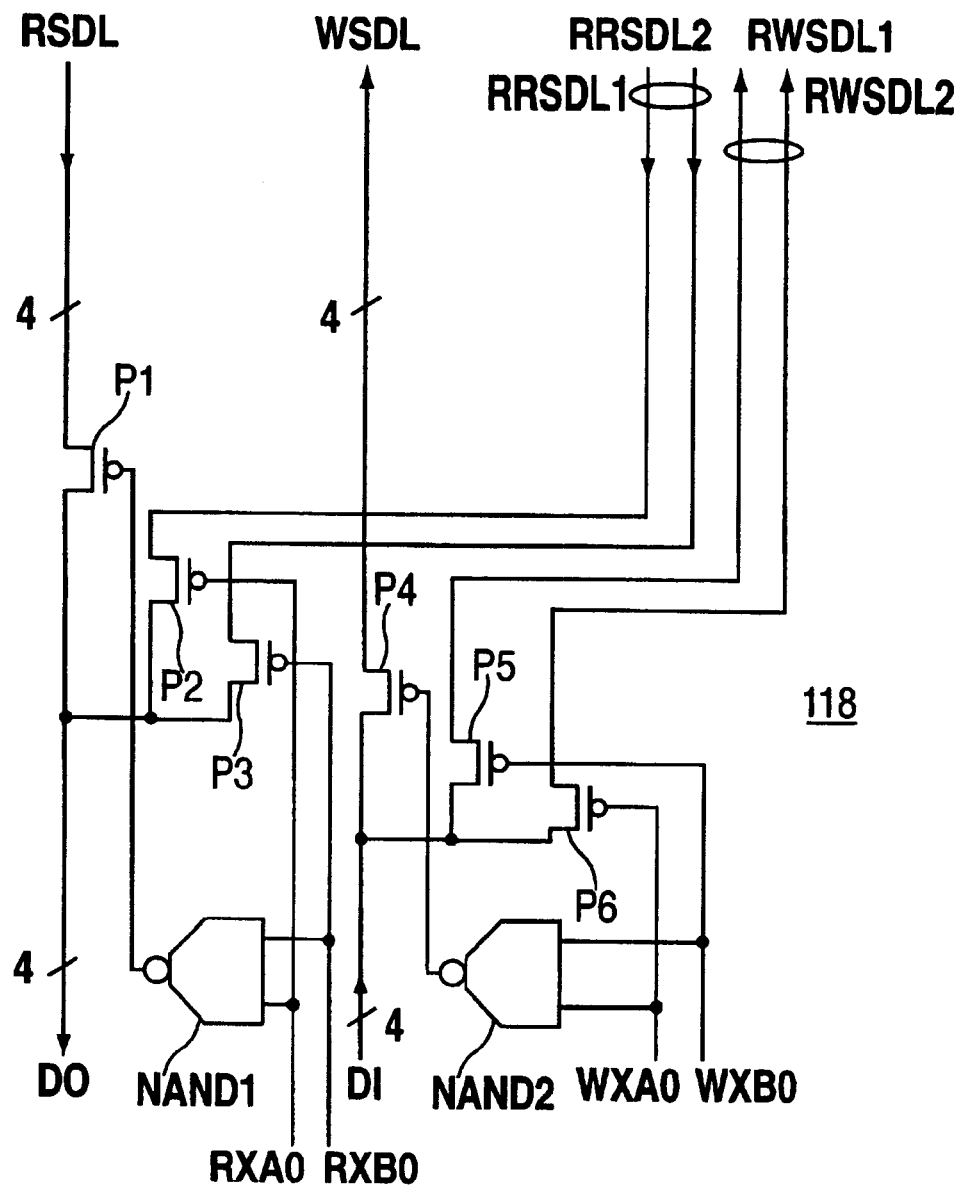
FIG. 9(a) is a schematic diagram of an exemplary redundancy circuit block which may be included in each of the column redundancy system embodiments.
Figure 9B:
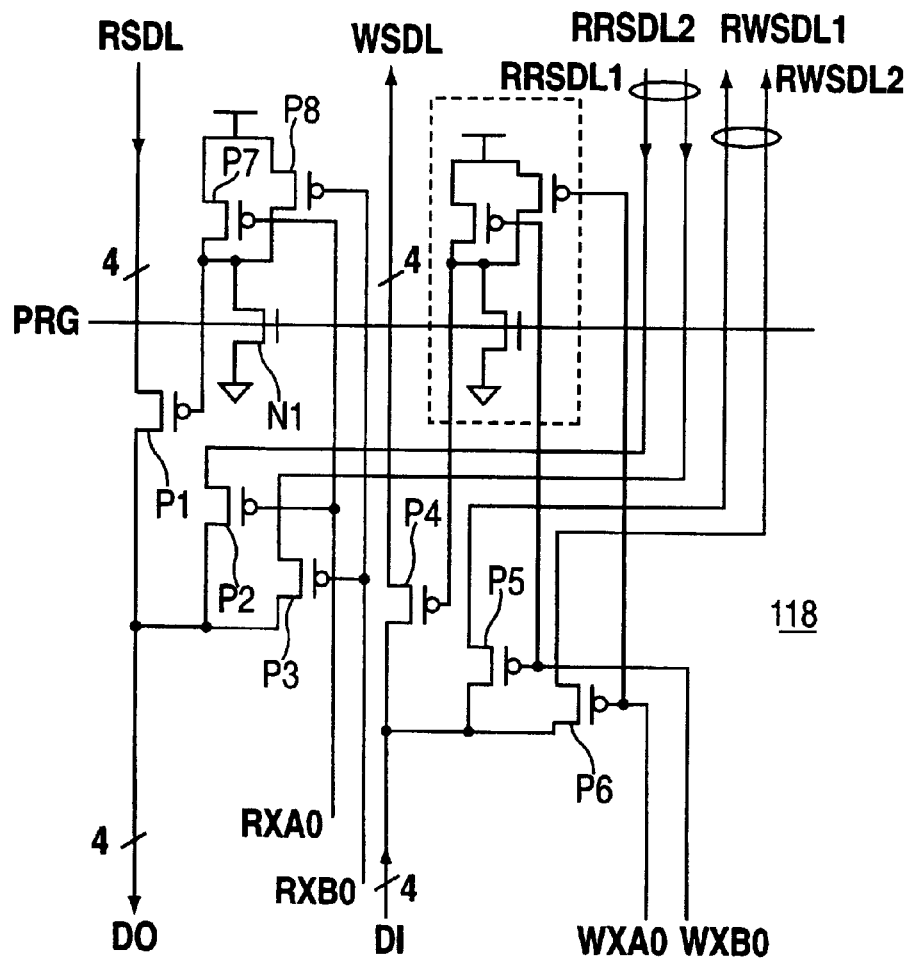
FIG. 9(b) is an alternative embodiment of FIG. 9(a)

Referring now to FIG. 9(a), there is shown a schematic diagram of a possible implementation of the redundancy circuit block 118 included in each of the three redundancy system embodiments. The redundancy circuit block 118 includes the read and write multiplexer circuits 22, 20, shown in FIG. 1. For ease of illustration, FIG. 9 shows just a single group of read and write switches (multiplexers) as controlled by the value of the bits coming from the column decoders 16 (e.g., WXA0, WXB0, RXA0, RXB0).

As can be seen, for each group of normal data lines (36 groups in this example), the redundancy circuit block 118 includes two groups of switches. A first group of switches, including PFET groups P1, P2 and P3, are read switches used to swap the read redundancy lines for defective read data lines. A second group of switches, including PFET groups P4, P5 and P6, are write switches used to swap the write redundancy lines for defective write data lines. It will be recalled that data lines are replaced by redundant elements in groups of four. Thus, FIG. 9 schematically illustrates a group of four read data lines RSDLs coming from secondary sense amplifiers (not shown) in the array, and a group of four write data lines WSDLs going to second sense amplifiers (not shown) in the array. The redundant data lines include two groups of redundancy read lines (RRSDL1, RRSDL2), and two groups of redundancy write lines (RWSDL1, RWSDL2) for replacement.

If any line(s) in a group of read data lines or write data lines are found defective, the appropriate switching and signaling is provided to swap the good redundancy data lines with the defective ones. The redundancy data lines are also tested to determine whether they are in good condition. It will be assumed, for example, that at least one of the data lines within the illustrated group of RSDLs and the group of WSDLs are bad. It is further assumed that the RSDL read datalines are to be replaced with the RRSDL1 data lines, and the WSDL write datalines are to be replaced with the RWSDL1 data lines. In a normal operating configuration with no redundancy replacement, the signals on RXA0 and RXB0 are both high, meaning that PFET groups P2 and P3 remain off and thus the redundant data line groups RRDSL1 and RRSDL2 are not coupled to data out line DO. Since the output of NAND gate NAND1 is low, PFET group P1 is on, and the normal read data line group RSDL is coupled to DO. The same normal operating configuration applies to the normal and redundant write data line groups.

However, for the replacement operation described above, the signals on RXA0 and WXB0 will be switched to low (i.e, active low), while the signals on RXB0 and WXA0 remain high. The resulting outputs of both NAND1 and NAND2 switch from low to high, thereby switching off PFET groups P1 and P4, respectively. At the same time, PFET group P2 is switched on to couple RRSDL1 to DO, and PFET group P5 is switched on to couple D1 to RWSDL1. As will be appreciated, for each group of four data lines within the array, seven switching devices are used to perform the switching activities; three PFET transfer gates, and four transistors comprising a NAND gate. In order to conserve device space, an alternative embodiment for the redundancy circuit block 118 is presented in FIG. 9(b).

An operating assumption of the array is that the majority of normal data lines are good, with only a very small percentage thereof needing to be replaced by the redundancy elements. Accordingly, the embodiment of FIG. 9(b) uses a precharge signal (PRG) to select the normal read/write data line. The normal data line is deselected only if it is found to be defective. In lieu of the NAND gate used in FIG. 9 (a), a dynamic 3-transistor configuration (including pull down NFET N1 and pull up PFETs P7 and P8) is used. Since the operation of the read and write switching circuitry is the same, only one will be described in detail.

If each of the RSDL lines in the group are functional, then RXA0 and RXB0 are both high, and thus P2 and P3 remain off. In addition, pull up PFETs P7 and P8 also remain off. Signal PRG, being precharged to high, turns on pull down device N1, causing the gate of P1 to be pulled low and thus activating P1. Now, if RSDL were to be replaced by RRSDL1, for example, then PRG would be discharged while RXA0 would be low. This causes both P2 and P7 to turn on while N1 is turned off. As a result, the gate of P1 is pulled up to high through P7, thereby switching P1 off. Thus, by implementing a three transistor configuration with a precharged line, the function of a four-transistor NAND gate may be accomplished, thereby conserving valuable device real estate.

Figure 10A:
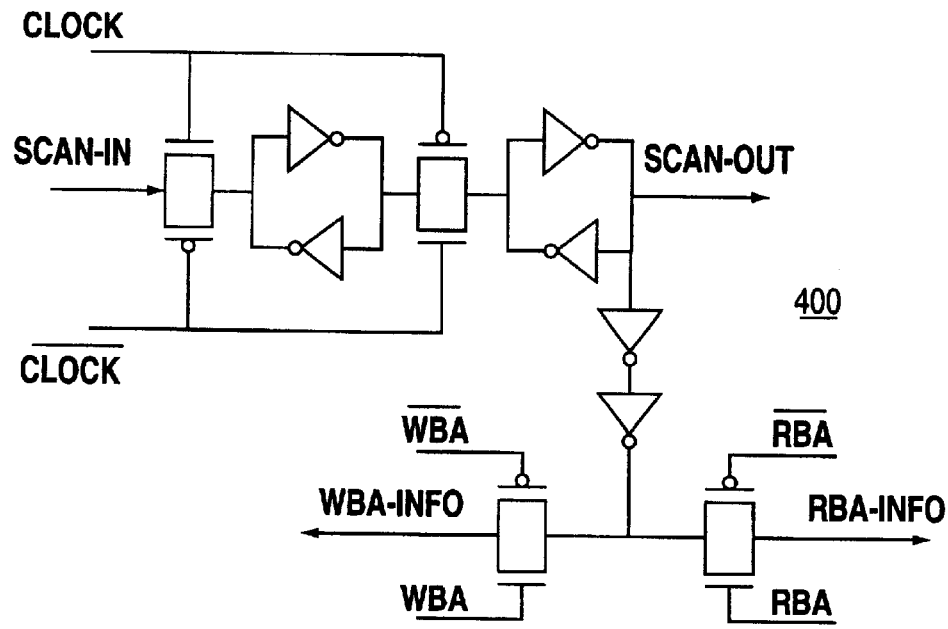
FIGS. 10(a) through 10(c) are schematic diagrams illustrating an exemplary fuse register structure for the first embodiment of FIGS. 2 and 3.
Figure 10B:
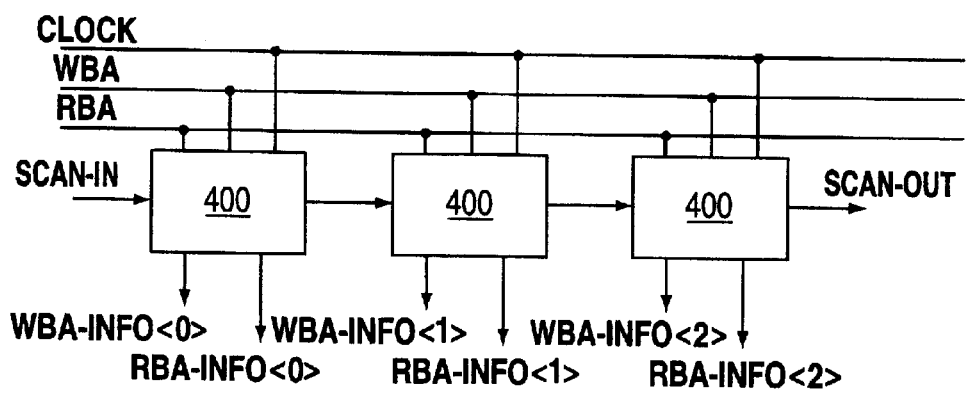
Figure 10C:
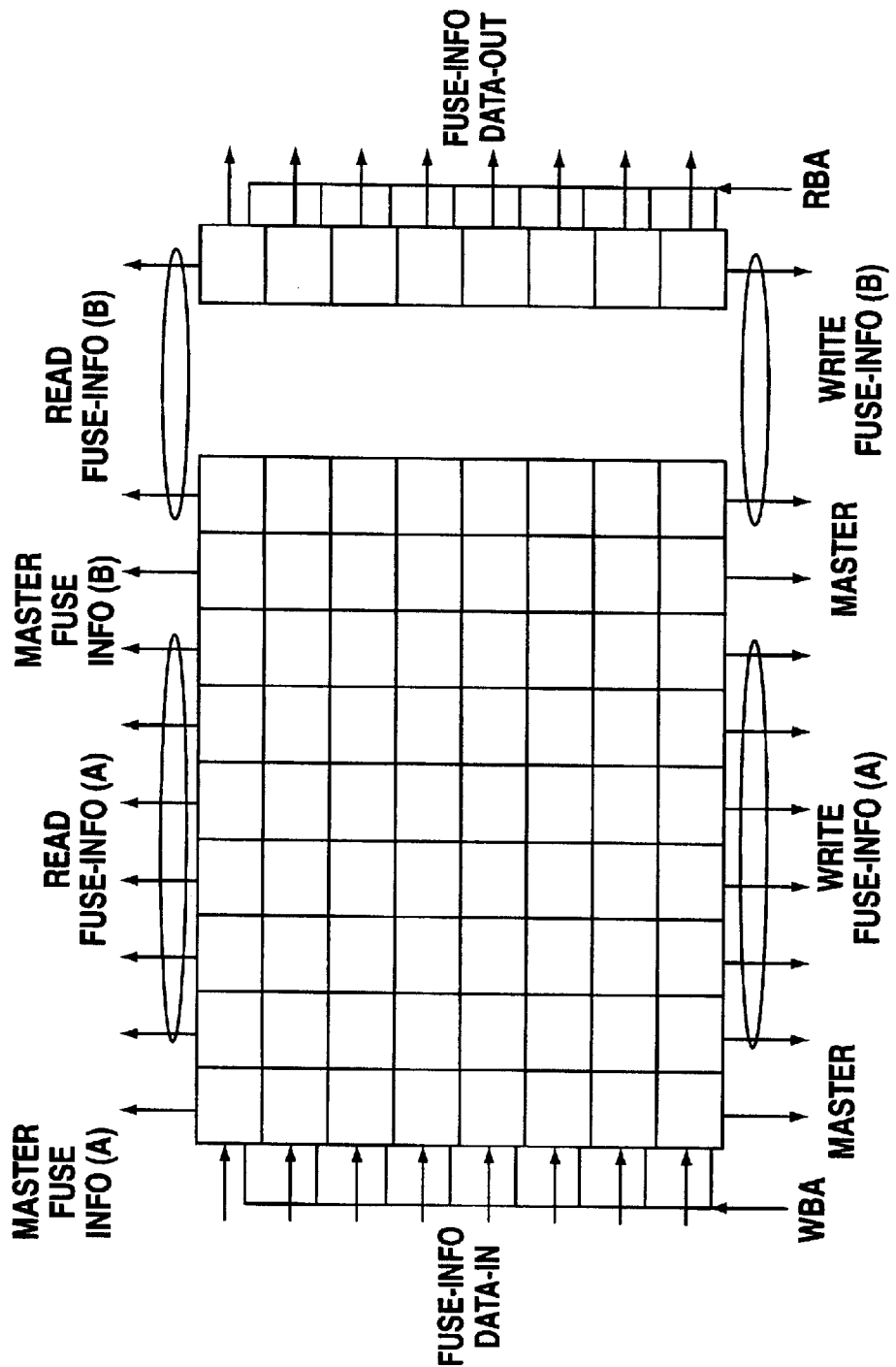

Finally, an exemplary fuse register structure (as implemented in the first embodiment of FIGS. 2 and 3) is depicted in FIGS. 10(a)<10(c). In FIG. 10(a), there is shown a schematic diagram of an individual fuse register cell 400 included within the fuse register block 106 of FIGS. 2 and 3. During system power up, a scan clock signal (and complementary clock signal) is applied provided to each individual cell 400 within the fuse register block 106, so that data may be scanned in from the first fuse register cell and sequentially shifted to the last fuse register cell. In FIG. 10(b), three sequential fuse register cells are shown. Once the fuse information is loaded into the individual cells, the data may be retrieved through the read and write bank addresses (RWA, and RBA). In the first embodiment discussed above, therefore, 14 register cells are connected in parallel to store the fuse information to be decoded for either a read or write operation. If the eight fuse register blocks 106 (FIG. 2) are grouped together, as shown in FIG. 10(c), then the fuse information for all eight blocks may be scanned in parallel during loading of the register array. Once the array is fully loaded, parallel groups of fuse information (14 bits for read and 14 bits for write) can be retrieved through the WBA and RBA address bits. Additional details regarding the design and arrangement of shift registers are well known in the art and are not discussed in further detail.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A column redundancy system for a memory array configured into a plurality of individual micro-cells, the system comprising:

a column redundancy apparatus for performing a redundancy swapping operation of column elements within the individual micro-cells, said column redundancy apes further comprising:

a fuse information storage device for storing fuse information for each individual micro-cell, said fuse information indicative of the location of any defective column elements therein;

a first bank address decoding mechanism for decoding a read bank address corresponding to a first micro-cell accessed for a read operation;

a second bank address decoding mechanism for decoding a write bank address corresponding to a second micro-cell accessed for a write operation, said second micro-cell capable of being accessed simultaneously with said first micro-cell;

a first compare circuit for comparing said decoded read bank address to specific fuse information corresponding to said first micro-cell; and a second compare circuit for comparing said decoded write bank address to specific fuse information corresponding to said second micro-cell;

wherein, if said first compare circuit determines that there is at least one defective column element contained within said first micro-cell, then said column redundancy apparatus generates an internal column address corresponding to said at least one defective column element in said first micro-cell; and if said second compare circuit determines that there is at least one defective column element contained within said second micro-cell, then said column redundancy apparatus generates an internal column address corresponding to said at least one defective column element in said second micro-cell.

2. The column redundancy system of claim 1, wherein:

said internal column address corresponding to said at least one defective column element in said first micro-cell, if generated, is used by a read multiplexer circuit within said column redundancy apparatus to perform said redundancy swapping operation for said first micro-cell; and said internal column address corresponding to said at least one defective column element in said second micro-cell, if generated, is used by a write multiplexer circuit within said column redundancy apparatus to perform said redundancy swapping operation for said second micro-cell.

3. The column redundancy system of claim 2, wherein said fuse information for each individual micro-cell includes a master bit for determining whether any defective column elements are present within the micro-cell, and a group of slave bits for determining the location of any said defective column elements within the micro-cell.

4. The column redundancy system of claim 1, further comprising:

a first pair of column decoders, one of said first pair of column decoders capable of generating a column address for a first defective column element in said first micro-cell, and another of said first pair of column decoders capable of generating a column address for a second defective column element in said first micro-cell; and a second pair of column decoders, one of said second pair of column decoders capable of generating a column address for a first defective column element in said second micro-cell, and another of said second pair of column decoders capable of generating a column address for a second defective column element in said second micro-cell.

5. The column redundancy system of claim 2, wherein:

the plurality of individual micro-cells within the memory array are arranged into micro-cell blocks; and said fuse information storage device further comprises a plurality of fuse register blocks, said fuse register blocks being disposed in proximity to said micro-cell blocks.

6. The column redundancy system of claim 5, wherein:

said first bank address decoding mechanism comprises a read bank address decoder; and said second bank address decoding mechanism comprises a write bank address decoder.

7. The column redundancy system of claim 2, wherein said fuse information storage device further comprises:

a first static random access memory (SRAM) array, said first SRAM array being accessed for a read operation; and a second static random access memory (SRAM) array, said second SRAM array being accessed for a write operation.

8. The column redundancy system of claim 7, wherein said fuse information for each individual micro-cell is stored within both said first and said second SRAM arrays.

9. The column redundancy system of claim 2, wherein said fuse information storage device further comprises:

a dual port, static random access memory (SRAM) array, one port capable of being accessed only during a read operation, and the other port capable of being accessed during a read or a write operation.

10. The column redundancy system of claim 9, wherein said fuse information for each individual micro-cell is stored within an individual wordline within said dual port SRAM array.

* * * * *